(12) United States Patent
Zheng et al.

(10) Patent No.: US 9,640,451 B2
(45) Date of Patent: May 2, 2017

(54) WAFER BONDING STRUCTURES AND WAFER PROCESSING METHODS

(71) Applicant: Semiconductor Manufacturing International (Shanghai) Corporation, Shanghai (CN)

(72) Inventors: Chao Zheng, Shanghai (CN); Wei Wang, Shanghai (CN); Junde Ma, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 14 days.

(21) Appl. No.: 14/597,569

(22) Filed: Jan. 15, 2015

(65) Prior Publication Data
US 2015/0380327 A1 Dec. 31, 2015

(30) Foreign Application Priority Data

Jun. 30, 2014 (CN) .......................... 2014 1 0308855

(51) Int. Cl.
| | |
|---|---|
| *H01L 21/306* | (2006.01) |
| *H01L 21/304* | (2006.01) |
| *H01L 21/20* | (2006.01) |
| *H01L 21/66* | (2006.01) |
| *H01L 21/02* | (2006.01) |

(Continued)

(52) U.S. Cl.
CPC ........ *H01L 22/32* (2013.01); *H01L 21/02057* (2013.01); *H01L 21/304* (2013.01); *H01L 21/306* (2013.01); *H01L 21/3065* (2013.01); *H01L 21/78* (2013.01); *H01L 22/14* (2013.01)

(58) Field of Classification Search
None
See application file for complete search history.

(56) References Cited

U.S. PATENT DOCUMENTS

| | | | | |
|---|---|---|---|---|
| 5,279,975 A | * | 1/1994 | Devereaux | ......... G01R 31/2884 |
| | | | | 257/E21.525 |
| 2006/0219275 A1 | * | 10/2006 | Weber | ................. H01L 21/6704 |
| | | | | 134/64 R |

(Continued)

FOREIGN PATENT DOCUMENTS

WO    WO-2014003056 A1 *  1/2014  ........... H01L 21/304

*Primary Examiner* — Johannes P Mondt
(74) *Attorney, Agent, or Firm* — Anova Law Group, PLLC

(57) ABSTRACT

A wafer processing method is provided. The method includes providing a to-be-processed wafer having a first surface with a plurality of the device regions and dicing groove regions between adjacent device regions and a second surface; and providing a capping wafer having a first surface and a second surface. The method also includes bonding the first surface of the capping wafer with the first surface of the to-be-processed wafer. Further, the method includes performing an edge trimming process onto the to-be-processed wafer to cause a radius of the to-be-processed wafer to be smaller than a radius of the capping wafer; and grinding the second surface of the capping wafer. Further, the method also includes cleaning the second surface of the capping wafer; and etching a portion of the grinded and cleaned capping wafer to expose the dicing groove regions on the first surface of the to-be-processed wafer.

16 Claims, 6 Drawing Sheets

(51) Int. Cl.
*H01L 21/78* (2006.01)
*H01L 21/3065* (2006.01)

(56) References Cited

U.S. PATENT DOCUMENTS

| | | | | |
|---|---|---|---|---|
| 2007/0093065 A1* | 4/2007 | Tsurugida | ......... | H01L 21/02052 438/692 |
| 2011/0062532 A1* | 3/2011 | Wang | ................ | B81C 1/00333 257/415 |
| 2011/0266560 A1* | 11/2011 | Yao | .................... | H01L 33/0079 257/88 |
| 2013/0020713 A1* | 1/2013 | Premachandran | .. | H01L 21/6836 257/773 |
| 2013/0248099 A1* | 9/2013 | Shimizu | .............. | H01L 21/6835 156/247 |
| 2014/0073224 A1* | 3/2014 | Yamashita | ............ | H01L 21/302 451/29 |
| 2014/0106649 A1* | 4/2014 | Kim | .................... | H01L 21/6835 451/54 |
| 2015/0179494 A1* | 6/2015 | Kawamori | ............. | C09J 179/08 438/464 |

* cited by examiner

WAFER BONDING STRUCTURES AND WAFER PROCESSING METHODS

CROSS-REFERENCES TO RELATED APPLICATIONS

This application claims the priority of Chinese patent application No. 201410308855.0, filed on Jun. 30, 2014, the entirety of which is incorporated herein by reference.

FIELD OF THE INVENTION

The present invention generally relates to the field of semiconductor manufacturing technology and, more particularly, relates to wafer bonding structures and wafer processing methods.

BACKGROUND

In a semiconductor fabrication process, it needs to dice a wafer having semiconductor devices formed on its surface into a plurality of chips, then each of the chips is packaged to form integrated circuits or chip devices. For the wafer level chip size packaging (WLCSP) technology, the wafer is tested after being packaged; and then the packaged wafer is diced in individual ready-to-use chips. The size of the packaged chip is identical to the size of the bare chip. The size of the chips after the WLCSP is able to reach the high level miniaturization; and the cost of the chips is significantly reduced by decreasing the chip size and increasing the wafer size.

With the continuous development of the semiconductor manufacturing technology, the fabrication methods of semiconductor devices and the device structures of the semiconductor devices have become more and more complex, thus the semiconductor fabrication processes performed on only one side of a wafer are unable to match the continuous development of the semiconductor manufacturing technology. Some fabrication processes have been developed to fabricate devices and chips on both sides of the wafer, such as the fabrication process of MEMS pressure sensors, the fabrication process of the backside illuminated (BSI) image sensors, the fabrication process of the through silicon via (TSV) structures, or wafer packaging processes, etc. Such fabrication processes all need to perform back-end-of-line (BEOL) processes on the other side of the wafer after forming semiconductor device structures on one side of the wafer. Then, the wafer is diced into chips after the BEOL processes.

In order to prevent the semiconductor device structures formed on the one side of the wafer from being damaged when the BEOL processes are performed on the other side of the wafer, a supporting wafer is usually bonded with the one side of the wafer having the semiconductor device structures. The supporting wafer may be used to protect the semiconductor device structures on the one side of the wafer during the BEOL processes; and the subsequent edge trimming process, grinding process and the dicing process, etc.

Because the wafer bonding process for bonding the supporting wafer with the wafer having the devices structures includes a pressing process (pre-bonding) and a thermal annealing process, the wafer bonding process may affect the properties of the device structures formed on the wafer. Therefore, the existing methods usually test the electrical properties of the device structures after etching the supporting wafer to expose the testing structures. The testing results may be used to determine the effect to device structures formed on the surface of the wafer caused by the wafer bonding process.

However, because the testing procedure is performed after the wafer bonding process, the testing results may not be precise because of the wafer bonding process and other processes; and it may affect the further improvements of the fabrication process. The disclosed device structures and methods are directed to solve one or more problems set forth above and other problems.

BRIEF SUMMARY OF THE DISCLOSURE

One aspect of the present disclosure includes a wafer processing method. The method includes providing a to-be-processed wafer having a first surface with a plurality of device regions and dicing groove regions between adjacent device regions and a second surface corresponding to the first surface. The method also includes providing a capping wafer having a first surface of the capping wafer and a second surface of the capping wafer corresponding to the first surface of the capping wafer; and bonding the first surface of the capping wafer with the first surface of the to-be-processed wafer to cause an edge of the capping wafer to coincide with an edge of the to-be-processed wafer and the dicing groove regions to form chambers with the first surface of the capping wafer. Further, the method includes performing an edge trimming process onto the to-be-processed wafer to cause a radius of the to-be-processed wafer to be smaller than a radius of the capping wafer such that the capping wafer provides an umbrella function with the respect to the to-be-processed wafer; and grinding the second surface of the capping wafer to reduce a thickness of the capping wafer to a pre-determined value. Further, the method also includes cleaning the second surface of the capping wafer; and etching a portion of the grinded and cleaned capping wafer to expose the dicing groove regions on the first surface of the trimmed to-be-processed wafer.

Another aspect of the present disclosure includes a wafer bonding structure. The wafer bonding structure includes a trimmed to-be-processed wafer having a first surface, a plurality of the devices regions and a plurality of dicing groove regions between adjacent device regions. The wafer bonding structure also includes a plurality of device layers formed on the first surface of the trimmed to-be-processed wafer in the device regions and a plurality of the dicing grooves formed between adjacent device layers. Further, the wafer bonding structure includes a grinded and etched capping wafer with a first surface of the grinded and the etching capping water bonded with the device layers of the trimmed to-be-processed wafer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

After the wafer bonding process for bonding the support wafer with the testing wafer (the wafer having the semiconductor device structures), spaces or chambers may be formed between the supporting wafer and the dicing grooves of the testing wafer. Further, before etching the supporting wafer, it may need to perform a polishing process to thin the supporting wafer, and it may also need to clean the wafer bonding structure having the supporting wafer and the testing wafer. The cleaning solution may easily flow into the chambers; and the cleaning solution in the chambers may be difficult to flow out. Thus, the device structures formed on the surface of the testing wafer may be corroded; the performance of the device structures may be affected; and the testing results on the testing wafer may be inaccurate.

Figure 1:
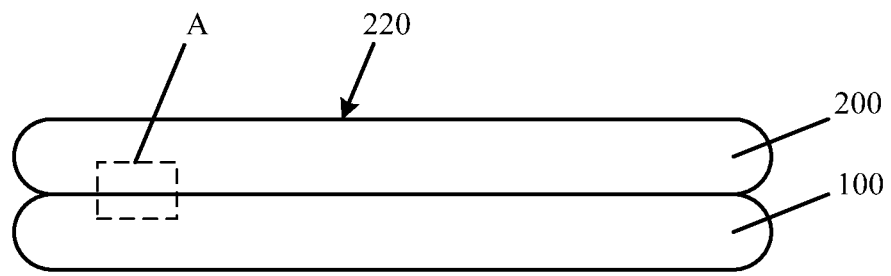
FIGS. 1-4 illustrate structures corresponding to certain stages of an existing wafer processing method.

FIGS. 1~4 illustrate structures corresponding to certain stages of a wafer processing method. As shown in FIG. 1, the method includes providing a testing wafer 100. The testing wafer 100 may have a first surface (not labeled) and a second surface (not labeled). The first surface of the testing wafer 100 may have a plurality of chip region arranged in arrays; and dicing groove regions between the chip regions. The method also includes providing a support wafer 200. The supporting wafer 200 may have a first surface (not labeled) and a second surface 220. The first surface of the supporting wafer 200 and the first surface of the testing wafer 100 may be bonded together, and the device layer (chip regions) may contact with the first surface of the support wafer 200.

Figure 2:
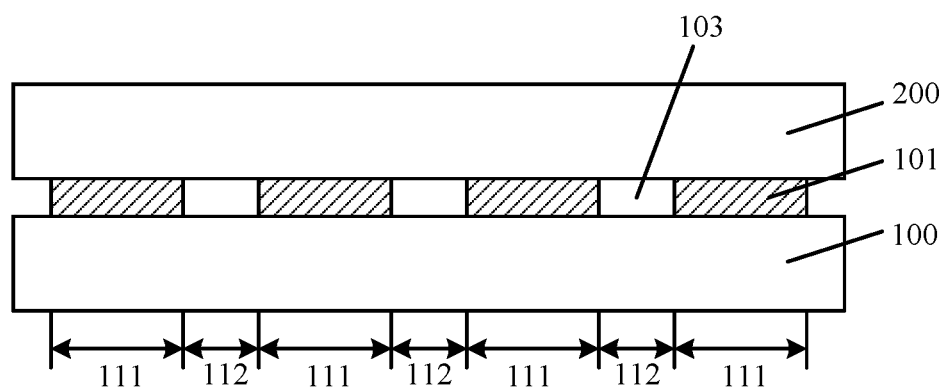

FIG. 2 illustrates an amplified structure of the region "A" shown in FIG. 1. As shown in FIG. 2, the surface of the chip regions 111 of the testing wafer 100 may have a plurality of device layers 101; and dicing grooves (not labeled) of the dicing groove regions 112 may be formed between adjacent device layers 101. When the testing wafer 100 is bonded with the supporting wafer 200, the dicing grooves and the supporting wafer 200 may form a plurality of chambers 103. The chambers 103 may connect with the outside environment.

Figure 3:
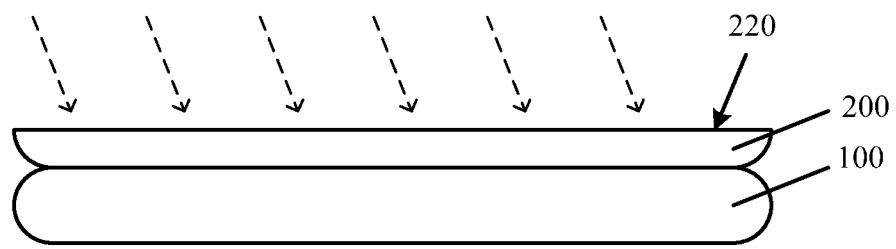
Figure 4:
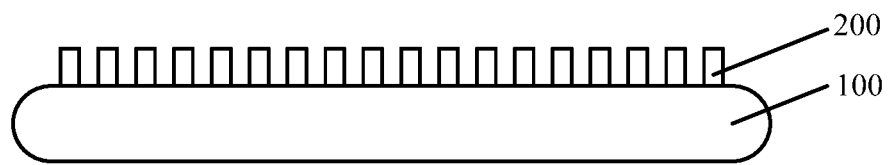

After the wafer bonding process, the second surface of the supporting wafer 200 may be grinded; and after the grinding process, the second surface of the supporting wafer 200 may be cleaned by a wet cleaning process. FIG. 3 illustrates a corresponding structure.

As shown in FIGS. 2~3, the dicing grooves and the supporting wafer 200 may form the chambers 103; and the chambers 103 may connect with the outside environment, thus it may be easy for the cleaning solution of the wet cleaning process to enter into the chambers 103. If the edge of the supporting wafer 200 and the edge of the testing wafer 100 are not trimmed, the edges may be round. It may be easy for the round edges where the support wafer 200 contacts with the testing wafer 100 to guide the cleaning solution of the wet cleaning process to enter into the chambers 103 under the impact of the cleaning solution. Further, if the cleaning solution enters into the chamber 103, it may be difficult to flow outside. Thus, the device layers 101 may be corroded. According to the disclosed methods and the structures, the corrosion issue of the device regions and the other issues may be solved by trimming the edge of the testing wafer to cause the diameter of the testing wafer to be smaller than the diameter of the supporting wafer.

Figure 15:
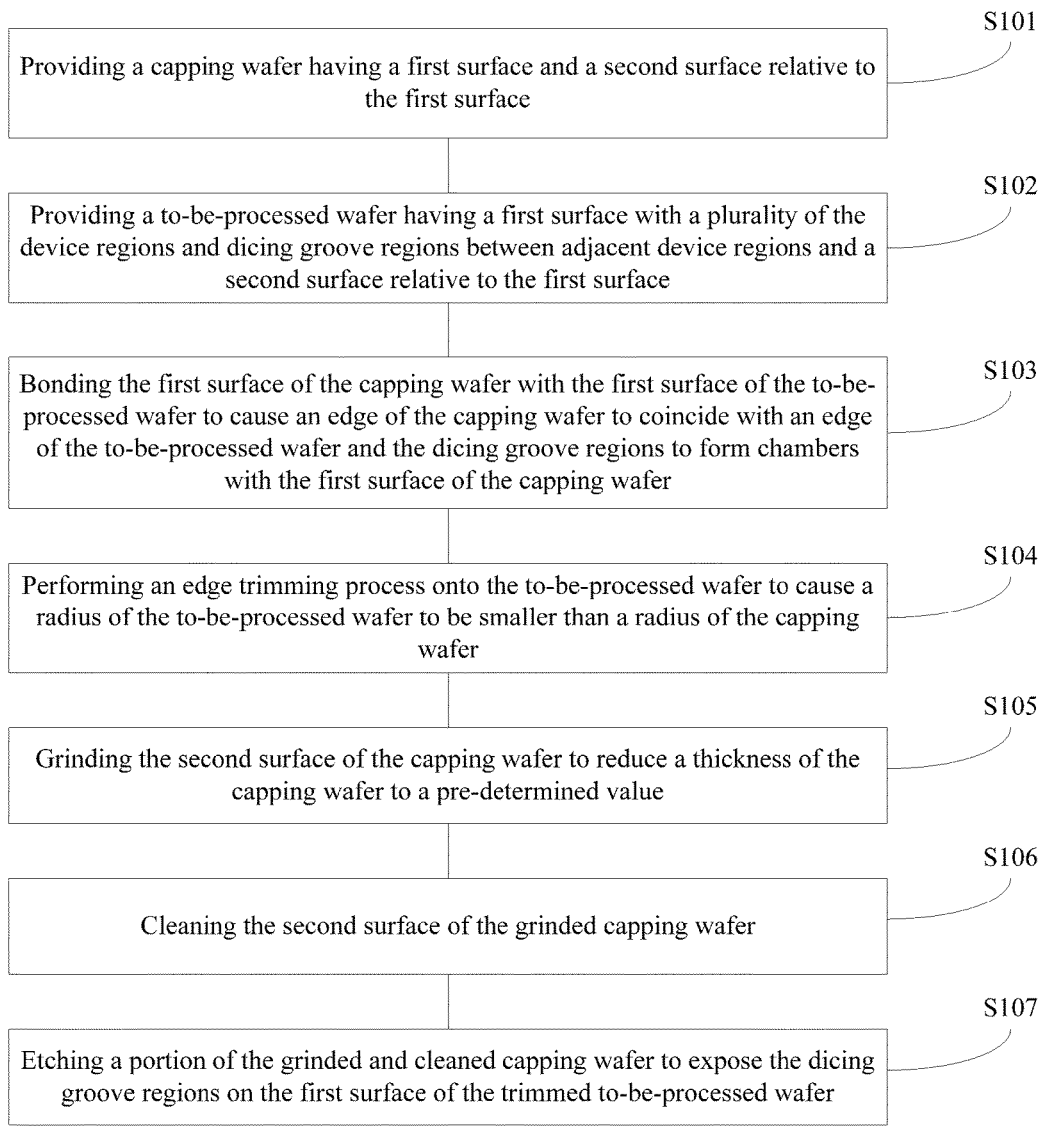
FIG. 15 illustrates an exemplary wafer processing method consistent with the disclosed embodiments.

FIG. 15 illustrates an exemplary wafer processing method; and FIGS. 5~13 illustrate structures corresponding to certain stages of the wafer processing method.

Figure 5:
FIGS. 5~13 illustrate structures corresponding to certain stages of a wafer processing method consistent with the disclosed embodiments.

As shown in FIG. 15, at the beginning of the wafer processing method, a capping wafer is provided (S101). FIG. 5 illustrates a corresponding structure.

As shown in FIG. 5, a capping wafer 300 is provided. The capping wafer 300 may have a first surface 301 and a second surface 302 relative the first surface 301. The capping wafer 300 may be used to subsequently bond with a to-be-processed wafer to process subsequent processes on the to-be-processed wafer, such as a back-side process, an edge trimming process and a grinding process, or a dicing process, etc.

The capping wafer 300 may be any appropriate materials, such as silicon, silicon on insulator (SOI), germanium on insulator (GOI) silicon germanium, carborundum, indium antimonide, lead telluride, indium arsenide, indium phosphide, gallium arsenidie, gallium nitride, gallium antimonite, or glass, etc. In one embodiment, the capping wafer 300 is a silicon wafer.

During a process for forming the silicon wafer, the edge of the freshly cut silicon wafer may be sharp angles because the single crystal silicon is a brittle material. In order to prevent the cracks on the edge from affecting the strength of the silicon wafer; damaging the smoothness of the wafer surface; and carrying contaminating particles, etc., an edge profiling process may be performed. The edge profiling process may be used to trim the shape and diameter of the edge of the wafer to cause the edge of the wafer to present a round angle. Thus, in one embodiment, the edge of the capping wafer 300 is round.

The first surface 301 of the capping wafer 300 may be subsequently bonded with a to-be-processed wafer. In one embodiment, a plurality of conductive layers (not shown) may be formed on the first surface 301 of the capping wafer 300. The conductive layers and the conductive structures on the first surface of the subsequently provided to-be-processed wafer may be fused together to achieve a wafer bonding. In certain other embodiments, an insulation layer (not shown) may be formed on the first surface 301 of the capping wafer 300. The insulation layer may be fused with the dielectric layer on the to-be-processed wafer to form a wafer bonding.

In certain other embodiments, the first surface 301 of the capping wafer 300 may have a plurality of arrays of device regions (not shown). Dicing groove regions may be configured between adjacent device regions. The device regions may be used to form individual chips. Device structures may be formed on the surface of the device regions of the first surface 301 of the capping wafer 300. The capping wafer 300 may be subsequently bonded with the to-be-processed wafer; and the to-be-processed wafer and the capping wafer 300 may be overlapped. Thus, an overlapped three-dimensional packaging structure may be formed.

Figure 6:
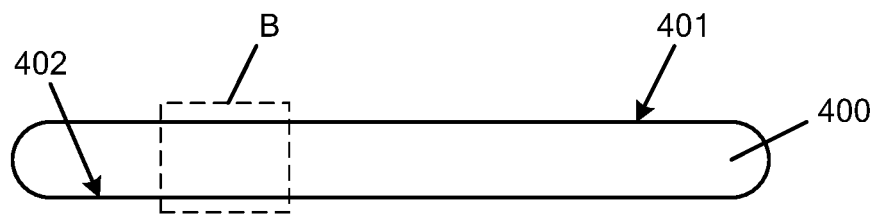
Figure 7:
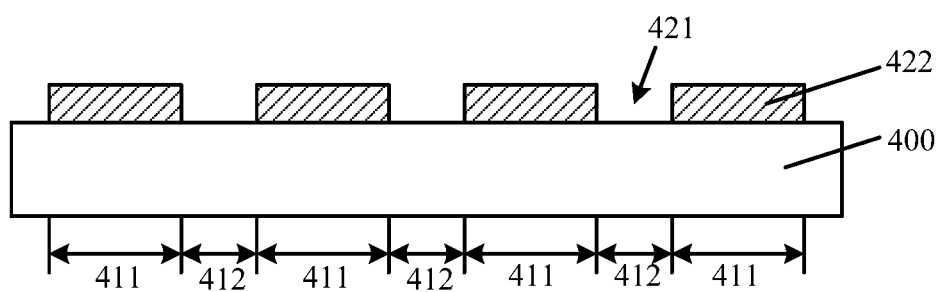

Returning to FIG. 15, after providing a capping wafer 300, a to-be-processed wafer may be provided (S102). FIGS. 6~7 illustrate a corresponding structure; and FIG. 7 illustrates a magnified image of the region "B" illustrated in FIG. 6.

As shown in FIG. 6, a to-be-processed wafer 400 is provided. The to-be-processed wafer 400 may have a first surface 401 and a second surface 402 relative to the first surface 401. The first surface 401 of the to-be-processed wafer 400 may have a plurality of the device regions 411 and dicing groove regions 412 between adjacent device regions 411.

The to-be-processed wafer 400 may be any appropriate materials, such as silicon, silicon on insulator (SOI), germanium on insulator (GOI) silicon germanium, carborundum, indium antimonide, lead telluride, indium arsenide, indium phosphide, gallium arsenidie, gallium nitride, gallium antimonite, or glass, etc. The to-be-processed wafer 400 may have a round edge. In one embodiment, the to-be-processed wafer 400 is a silicon wafer. The first surface 401 of the to-be processed wafer 400 may be subsequently bonded with the capping wafer 300.

The device regions 411 may be distributed as arrays. The to-be-processed wafer 400 in the device regions 411 may be used to form individual chips. The dicing groove regions 412 may be the regions for subsequently dicing the to-be-processed wafer 400 into chips; and the device regions 411 may be diced into single chips.

Referring to FIG. 7, the device regions 411 of the first surface 401 of the to-be-processed substrate 400 may have device layers 422. Dicing grooves 421 may be formed between adjacent device layers 422; and the device grooves 421 may be in the dicing groove regions 412.

Figure 9A:
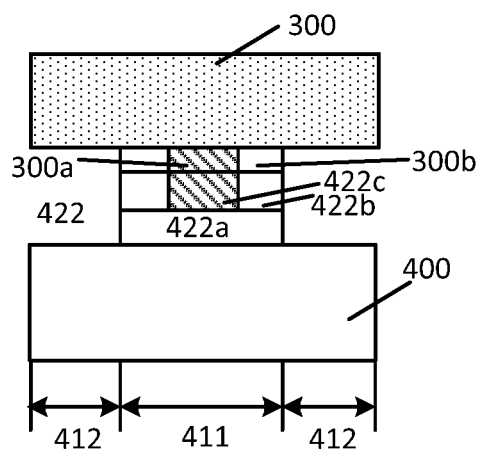

The device layers 422 may include device structures 422a formed in the device regions 411 of the first surface 401 of the to-be-processed wafer 400; a dielectric layer 422b covering the device structures formed on the first surface 401 of the to-be-processed wafer 400; and electrical interconnect structures 422c formed in the dielectric layer 422b, as shown in FIG. 9A. The electrical interconnect structures 422c may electrically connect with the device structures and the to-be-processed wafer 400. The top surface of the electrical interconnect structures 422c may be higher, or level with the surface of the dielectric layer 422b, as shown in FIG. 9A. The electrical interconnect structures 422c and the device structures 422a may form chip circuits.

The device structures may be any appropriate device structures. In one embodiment, the device structures may be MEMS device structures, such as MEMS pressure sensors, etc. In certain other embodiments, the device structures may be the device structures of BSI imaging sensors, the gate structures of the transistors, resistor structures, capacitance structures, inductor structures, or fuse structures, etc.

The electrical interconnect structures may be conductive vias formed on the surface of the device structures, and/or the surface of the to-be-processed substrate 400; and interconnect lines formed on the top of the conductive vias. The conductive vias and the interconnect lines may be made of any appropriate material, such as one or more of Cu, W, or Al, etc. The conductive vias may also be made of one or more of Ti, Ta, TiN, or TaN, etc.

The dielectric layer may be used to electrically isolate the device structures and the electrical interconnect structure. The dielectric layer may be made of any appropriate material, such as one or more of $SiO_x$, SiN, SiON, low-K material, or ultra-low K material, etc.

In order to test the properties of the chip circuits in the device layers 422 on the to-be-processed wafer 400 after bonding the capping wafer 300 with the to-be-processed wafer 400, a plurality of the testing pads (not shown) may be formed on the dicing groove regions 412 on the first surface 401 of the to-be-processed wafer 400. In one embodiment, the testing pads may be formed on the bottom of the dicing grooves 421. After subsequently bonding the capping wafer 300 with the to-be-processed wafer 400, it may need to etch the capping wafer 300 to expose the testing pads such that the properties of the chip circuits may be tested through the exposed testing pads.

Figure 8:
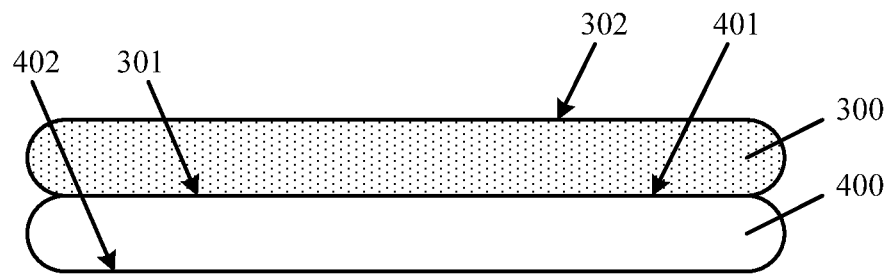

Returning to FIG. 15, after providing the to-be-processed wafer 400, a wafer bonding process may be performed to bond the capping wafer 300 and the to-be-processed wafer 400 together (S103). FIG. 8 illustrates a corresponding structure.

As shown in FIG. 8, the first surface 301 of the capping wafer 300 and the first surface 401 of the to-be-processed wafer 400 are bonded together. The edge of the to-be-processed wafer 400 may coincide with the edge of the capping wafer 300. The dicing groove regions 412 of the to-be-processed wafer 400 (referring to FIG. 7) and the capping wafer 300 may form a plurality of chambers.

The wafer bonding process may be used to fix the first surface 401 of the to-be-processed wafer 400 on the first surface 301 of the capping wafer 300. The wafer bonding process may include pressing the first surface 401 of the to-be-processed wafer 400 on the first surface 301 of the capping wafer 300; and followed by a thermal annealing process. Thus, the top surface of the electrical interconnect structures may be fused with the first surface 301 of the capping wafer 300.

The process for pressing the first surface 401 of the to-be-processed wafer 400 on the first surface 301 of the capping wafer 300 may be performed by applying opposite forces on the second surface 402 of the to-be-processed wafer 400 and the second surface 302 of the capping wafer 300. In one embodiment, the process for pressing the first surface 401 of the to-be-processed wafer 400 on the first surface 301 of the capping wafer 300 may be a vacuum pressing process.

In one embodiment, the first surface 301 of the capping wafer 300 may have a plurality of the conductive layers 300a, the positions of the conductive layers 300a may correspond to the top surfaces of the electrical interconnect structures 422c, as shown in FIG. 9A. In the thermal annealing process, the conductive layers 300a and the top surfaces of the electrical interconnect structures 422c may be fused together, thus the to-be-processed wafer 400 and the capping wafer 300 may be bonded together by the wafer bonding process.

In certain other embodiments, the first surface 301 of the capping wafer 300 may have an insulation layer 300b, as shown in FIG. 9A. In the thermal annealing process, the insulation layer 300b may be fused with the dielectric layer 422b of the first surface 401 of the to-be-processed wafer 400. Thus, the to-be-processed wafer 400 and the capping wafer 300 may be bonded together by the wafer bonding process.

In one embodiment, because the dicing groove regions 412 of the to-be-processed wafer 400 may have the dicing grooves 421, after the wafer bonding process, the dicing grooves 421 and the first surface 301 of the capping wafer 300 may form a plurality of chambers; and the chambers may connect with the outside environment. Further, in one embodiment, the device layers 422 (referring to FIG. 7) may have device structures including MEMS structures, etc., such as pressure sensors. The MEMS devices may also usually have chambers connecting with outside to obtain external information.

Further, the bottom of the dicing grooves 421 may have a plurality of testing pads. After the wafer bonding process, it may need to etch the capping wafer 300 to expose the testing pads in the dicing groove regions 412 so as to test the chip circuits in the device regions 411 of the to-be-processed wafer 400. The testing results may be used to determine if the fabrication process matches the design requirements. Further, the testing results may include the effects to the properties of the device layers 422 caused by the wafer bonding process, thus it may aid the reliability testing of the chip circuits; and it may aid the further improvements of the fabrication process.

Because the capping wafer 300 may be relatively thick, it may need to grind the second surface 302 of the capping wafer 300 before subsequently etching the capping wafer 300 to expose the dicing groove regions 412 of the to-be-processed wafer 400. After grinding the capping wafer 300, it may need to clean the second surface 302 of the capping wafer 300 by a wet cleaning process to remove the residual arming on the second surface 300 of the capping wafer 300. However, because the plurality of chambers connecting with the outside environment may be formed between the capping wafer 300 and the to-be-processed wafer 400; and the edge of the capping wafer 300 and the to-be-processed wafer 400 may be both rounded, it may be easy for the bonded edges of the capping wafer 300 and the to-be-processed wafer 400 to guide the cleaning solution of the wet cleaning process to flow into the chambers. Further, the cleaning solution flowing into the chambers may be difficult to flow out; and it may corrode the testing pads in the dicing groove regions 412 and the device layers 422 of the device regions 411. Thus, the properties of the chip circuits may be affected; and the accuracy of the subsequent chip circuit testing may also be affected.

Therefore, before grinding the second surface 302 of the capping wafer 300, the to-be-processed wafer 400 may be trimmed to cause the edge of the to-be-processed wafer 400 to be smaller than the edge of the capping wafer 300. After the edge trimming process, the capping wafer 300 may be able to prevent the cleaning solution from entering into the chambers between the to-be-processed wafer 400 and the capping wafer 300.

Figure 9B:
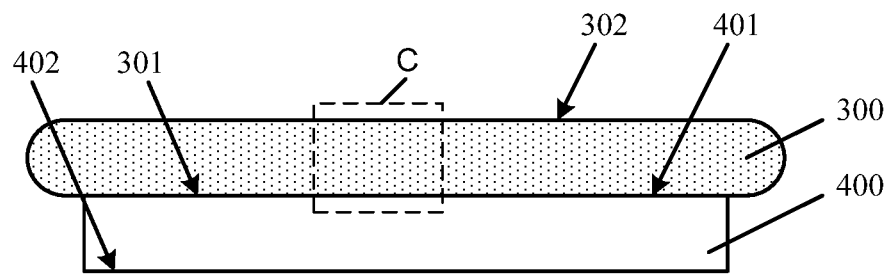

Returning to FIG. 15, after bonding the to-be-processed wafer 400 with the capping wafer 300, an edge trimming process may be performed onto the to-be-processed wafer 300 (S104). FIG. 9B illustrates a corresponding structure.

As shown in FIG. 9B, the to-be-processed wafer 400 is trimmed by the edge trimming process; and the diameter of the to-be-processed wafer 400 is smaller than the diameter of the capping wafer 300 after the edge trimming process. Thus, the edge of the capping wafer 300 may protrude from the edge of the to-be-processed wafer 400. When a subsequently cleaning process is performed onto the second surface 302 of the capping wafer 300, the protruding edge of the capping wafer 300 may serve as an umbrella function to prevent the cleaning solution expelled by the second surface 302 of the capping wafer 300 from downwardly flowing into the chambers between the capping wafer 300 and the to-be-processed wafer 400. Thus, the corrosion of the device layers 422 and the testing pads may be prevented.

Further, after the edge trimming process, the trimmed edge of the to-be-processed wafer 400 may be perpendicular to the first surface 401 of the to-be-processed wafer 400, and the edge of the capping wafer 300 may be round, when the cleaning solution is sprayed on the second surface 302 of the capping wafer 300, the cleaning solution may flow along the round edge of the capping wafer 300. The diameter of the to-be-processed wafer 400 may be smaller than the diameter of the capping wafer 300; and the edge of the to-be-processed wafer 400 may be perpendicular to the first surface 401 of the to-be-processed wafer 400, thus the clean solution flowing along the round edge may not contact with the edge of the to-be-processed wafer 400; and the edge of the to-be-process wafer 400 may be unable to guide the cleaning solution to flow into the chambers between the to-be-process wafer 400 and the capping wafer 300. Therefore, the corrosion of the device layers 422 and the testing pads may be prevented.

The edge trimming process may trim the to-be-processed wafer 400 to reduce the radius in a range of approximately 3 mm~5 mm such that the portion of the to-be-processed wafer 400 trimmed away may be in the peripheral region of the plurality of device regions 411, thus the edge trimming process may not damage the devices in the device regions 411 having the device layers 422. The to-be-processed wafer 400 may be suitable for subsequent single chip dicing after the edge trimming process.

The edge trimming process may feed from the edge of the to-be-processed wafer 400 to the center using a knife to reduce the radius of the to-be-processed wafer 400. The rotation speed of the knife may be in a range of approximately 2000 rpm~3000 rpm. The feeding speed of the knife may be in a range of approximately 5 μm~10 μm. The feeding depth of the knife may be in a range of approximately 400 μm~750 μm. In the edge trimming process, by controlling the feeding speed, the reduced value of the radius of the to be-processed wafer 400 may be precisely controlled.

Figure 10:
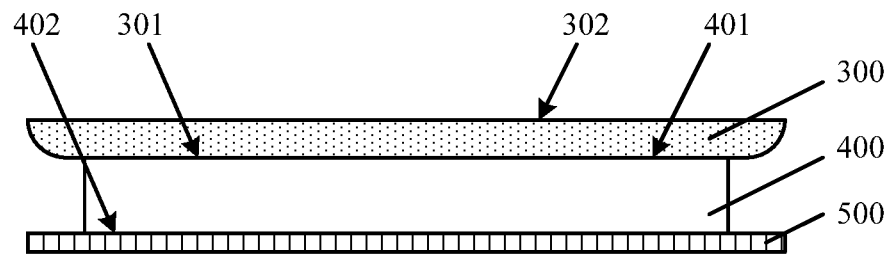

Returning to FIG. 10, after trimming the to-be-processed wafer 400, the second surface 302 of the capping substrate 300 may be grinded (S105). FIG. 10 illustrates a corresponding structure.

As shown in FIG. 10, the second surface 302 of the capping wafer 300 is grinded until the capping wafer 300 to have a pre-determined thickness. The grinding process of the second surface 302 of the capping wafer 300 may be a polishing process, such as a physical mechanical polishing process, or a chemical mechanical polishing process, etc. In one embodiment, a chemical mechanical polishing process is used to grind the second surface 302 of the capping wafer 300. By performing the polishing process onto the second surface 302 of the capping wafer 300, the thickness of the capping wafer 300 may be reduced, thus the etching depth for subsequently etching the capping wafer 300 may be reduced; and the process difficulties of the subsequent etching process may be reduced.

After grinding the second surface of the capping wafer 300, the thickness of the capping wafer may be in a range of approximately 3 μm~400 μm. The subsequent etching process may expose the dicing groove regions 412 of the to-be-processed wafer 400, thus the etching depth of the subsequent etching process may be the thickness of the grinded capping wafer 300. When thickness of the capping wafer 300 after the grinding process is in a range of approximately 3 μm~400 μm, it may lower the difficulty of the subsequent etching process.

Referring to FIG. 10, in one embodiment, after the edge trimming process and before the grinding process, a protective film 500 may be adhered on the second surface 402 of the to-be-processed wafer 400 by a foiling process. After the grinding process, the protective film 500 may be removed. The protective film 500 may be used to protect the second surface 402 of the to-be-processed wafer 400 during the grinding process; and the damages caused by the scratching between the second surface 402 of the to-be-processed wafer 400 and the base of the apparatus may be prevented.

Figure 11:
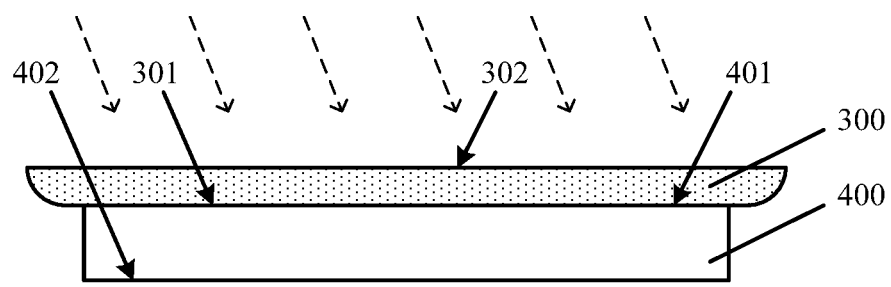

Returning to FIG. 15, after grinding the capping wafer 300, the second surface 302 of the grinded capping wafer 300 may be washed (S106). FIG. 11 illustrates a corresponding structure.

As shown in FIG. 11, a cleaning process may be performed onto the second surface 302 of the capping wafer 300. The cleaning process may be used to clean (remove) the residual contaminations and arming on the second surface 302 of the capping wafer 300 left by the previous grinding process. The cleaning process may be a dry cleaning process, or a wet cleaning process, etc. In one embodiment, the cleaning process is a wet cleaning process. The cleaning solution may include de-ionized (DI) water, etc.

The cleaning solution may be sprayed toward the second surface 302 of the capping wafer 300. The spray direction may be perpendicular to the second surface 302 of the capping wafer 300, or may have a pre-determined angle with the second surface 302 of the capping wafer 300. Referring to FIG. 11, in one embodiment, the spray direction has a pre-determined angle with the second surface 302 of the capping wafer 300 to impact the capping wafer 300.

Because the to-be-processed wafer 400 may be trimmed before the grinding process, the radius of the to-be-processed wafer 400 was reduced; the edge of the capping wafer 300 may protrude from the edge of the to-be-processed wafer 400. Thus, the cleaning solution flowing downwardly along the edge of the capping wafer 300 may not be easy to enter into the to-be-processed wafer 400 with the reduced radius during the cleaning process. That is, the cleaning solution may not be easy to enter into the chambers between the to-be-process wafer 400 and the capping wafer 300. Thus, the corrosion of the device layers 422 and the testing pads may be avoided. Further, the properties of the chip circuits in the device layers 422 may be ensured; and the accuracy of the testing results of the chip circuits subsequently performed on the testing pads may also be ensured.

In one embodiment, after the cleaning process and before etching the capping wafer 300, a speed ring dry process may be performed onto the wafer bonding structure of the to-be-process wafer 400 and the capping wafer 300. The speed ring dry process may be able to further remove the residual cleaning solution on the surface of the to-be-processed wafer 400 and the capping wafer 300, and the residual cleaning solution between the to-be-processed wafer 400 and the capping wafer 300. Thus, the damage to the device layers 422 and the testing pads caused by the cleaning solution may be further avoided. In one embodiment, after the cleaning process, the protective film 500 illustrated in FIG. 10 may be removed.

Figure 12:
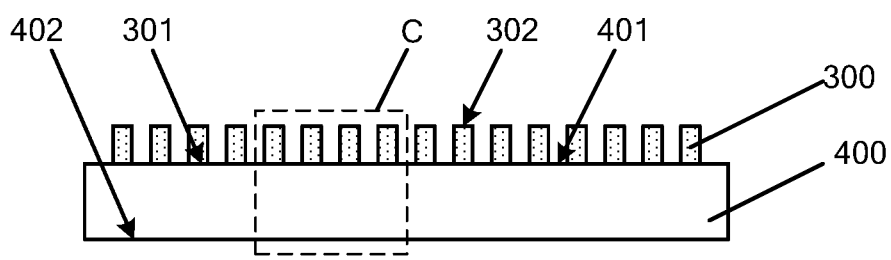
Figure 13:
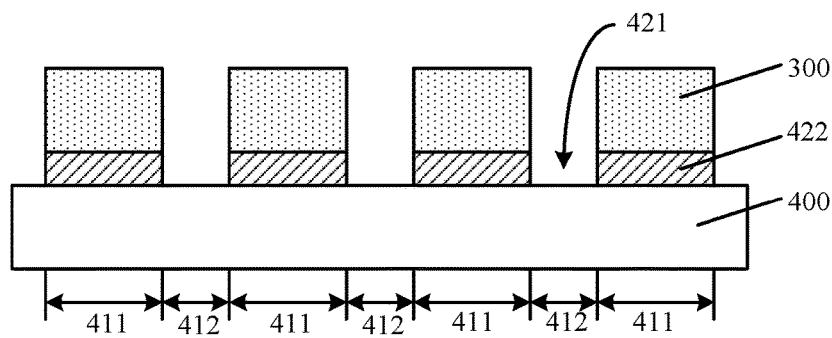

Returning to FIG. 15, after cleaning the second surface 302 of the capping wafer 300, a portion of the capping wafer 300 may be etched (S107). FIGS. 12-13 illustrate a corresponding structure; and FIG. 13 is a magnified image of the region "C" illustrated in FIG. 12.

As shown in FIGS. 12~13, a portion of the capping wafer 300 is etched and the dicing groove regions 412 of the to-be-processed wafer 400 are exposed. A process for etching the portion of the capping wafer 300 may include forming a mask layer (not shown) exposing a portion of the second surface 302 of the capping wafer 300 corresponding to the positions of the dicing groove regions 412 of the to-be-processed wafer 400 on the capping wafer 300; and followed by etching the capping wafer 300 using the mask layer as an etching mask until the dicing groove regions 412 of the to-be-processed wafer 400 are exposed.

Various processes may be used to etch the capping wafer 300. In one embodiment, the capping wafer 300 is made of silicon, thus the capping wafer 300 may be etched by an anisotropic dry etching process. The etching gas of the dry etching process may include $SF_6$, etc. The flow of the etching gas may be in a range of approximately 20 sccm~200 sccm. The bias power of the dry etching process may be greater than approximately 100 W. The pressure of the etching chamber of the dry etching process may be in a range of approximately 2 mTorr~200 mTorr. The etching time may be in a range of approximately 5 s-60 s.

After etching the portion of the capping wafer 300 to expose the dicing groove regions 412 of the first surface 401 of the to-be-processed wafer 400, a property testing may be performed onto the device regions 411 of the to-be-processed wafer 400 through the testing pads in the dicing groove regions 412 of the to-be-processed wafer 400. After the performance testing, if the properties of the chip circuits in the device regions 411 match the design requirements, the to-be-processed wafer 400 may be diced into single chips. Thus, the plurality of the device regions 411 may be diced into individual chips.

Figure 14:
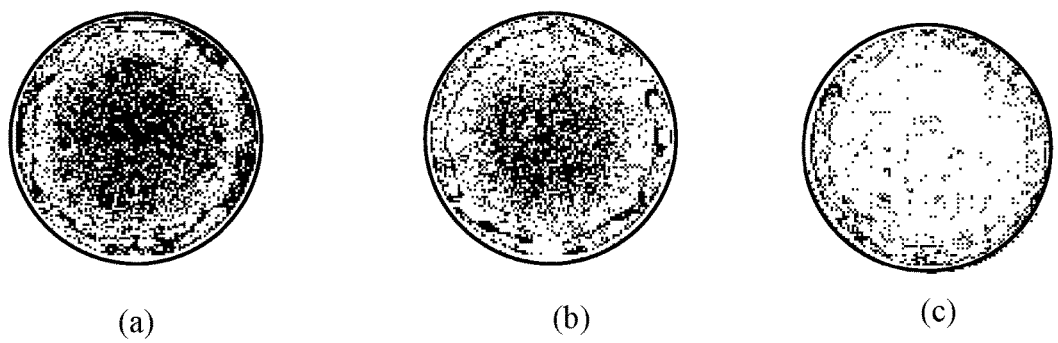
FIG. 14 illustrates the damages on the device regions of the to-be-processed wafer caused by different wafer processing methods.

Thus, accordingly, the disclosed wafer processing method may be able to reduce the damages on the first surface 401 of the to-be-processed wafer 400, and the defects on the first surface 401 of the to-be-processed wafer 400 may be tested after the previous cleaning process. FIG. 14 illustrates the distribution of the defects on the device regions 411 caused by different wafer processing methods.

FIG. 14(a) illustrates the defect distribution on the first surface 401 of the to-be-processed wafer 400 processed without the edge trimming process and without the speed ring dry process after the cleaning process. The black dots refer to the positions of the defect points on the first surface 401 of the to-be-processed wafer 400. FIG. 14(b) illustrates the defect distribution on the first surface 401 of the to-be-processed wafer 400 processed without the edge trimming process but with the speed ring dry process after the cleaning process. Thus, according to FIGS. 14(a)~(b), the defect number illustrated in FIG. 14(b) may be smaller than the defect number illustrated in FIG. 14(a), thus the speed ring dry process may reduced the defects on the first surface 401 of the to-be-processed wafer 400. FIG. 14(c) illustrates the defect distribution on the first surface 401 of the-to-be-processed wafer 400 processed with an edge trimming process and a speed ring dry process after the cleaning process. According to FIGS. 14(a)~(c), the defect number illustrated in FIG. 14(c) is less than the defect number illustrated in FIG. 14(a) and the defect number illustrated in FIG. 14(b). Therefore, by using the edge trimming process and the speed ring dry process, the defect number on the first surface 401 of the to-be-processed wafer 400 may be significantly reduced. That is, the disclosed structures and methods may be able to reduce the corrosion damages onto device layers 422 formed on the first surface 401 of the to-be-processed wafer 400 and the testing pads in the dicing grooves 421.

Thus, a wafer bonding structure may be formed by the above disclosed processes and the methods; and a corresponding wafer bonding structure is illustrated in FIGS. 12~13. As shown in FIGS. 12~13, the wafer bonding structure includes a trimmed to-be-processed wafer 400 having a first surface 401, a plurality of the devices regions 411 and a plurality of the dicing groove regions 412 between adjacent device regions 411. The wafer bonding structure also includes a plurality of the device layers 422 formed on the first surface 401 of the trimmed to-be-processed wafer 400 in the device regions 411 and a plurality of the dicing grooves 421 formed between adjacent device layers 421. Further, the wafer bonding structure includes a grinded capping wafer 300 with a first surface 301 bonded with the device layers 422. The detailed structures and intermediate structures are described above with respect to the fabrication processes.

In one embodiment, the first surface of the to-be-processed wafer may have a plurality of device regions and dicing groove regions between adjacent device regions. After bonding the first surface of the capping wafer with the first surface of the to-be-processed wafer, the first surface of the capping wafer and the dicing groove regions may form a plurality of chambers. Because it may need to subsequently etch the capping wafer to expose the dicing groove regions, it may need to grind the second surface of the capping wafer to reduce the thickness of the capping wafer. Further, after the grinding process, the second surface of the capping layer may be cleaned to remove the residual contaminations. In order to prevent the cleaning solution from entering the chambers formed between dicing groove regions and the first surface of the capping wafer, an edge trimming process may be performed onto the edge of the to-be-processes wafer to reduce the radius of the to-be-processed wafer to cause the radius of the to-be-processed wafer to be smaller than the radius of the capping wafer. When the subsequent cleaning process is performed, because the radius of the capping wafer may be smaller, the edge of the capping wafer may protrude from the edge of the to-be-processed wafer, the edge of the capping wafer may be able to prevent the cleaning solution from entering into the chambers formed between the dicing groove regions and the capping wafer. Thus, the corrosion of the device regions in the to-be-processed wafer may be avoided. Therefore, after etching the capping wafer to expose the dicing groove regions of the to-be-processed wafer, the performance testing results of the device regions of the to-be-processed wafer may be significantly accurate; and the performance testing results may be not be affected by the possible corrosion caused by the cleaning process.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A wafer processing method, comprising:
   providing a to-be-processed wafer having a first surface with a plurality of device regions and dicing groove regions between adjacent device regions, and a second surface corresponding to the first surface;
   providing a capping wafer having a first surface of the capping wafer and a second surface of the capping wafer corresponding to the first surface of the capping wafer;
   bonding the first surface of the capping wafer with the first surface of the to-be-processed wafer such that an edge of the capping wafer coincides with an edge of the to-be-processed wafer;
   performing an edge trimming process onto the to-be-processed wafer such that a radius of the to-be-processed wafer is smaller than a radius of the capping wafer and such that the capping wafer provides an umbrella function with respect to the to-be-processed wafer;
   grinding the second surface of the capping wafer to reduce a thickness of the capping wafer, thereby providing a thinned capping layer on the trimmed to-be-processed wafer; and
   etching the thinned capping wafer, thereby exposing the first surface of the trimmed to-be-processed wafer of the dicing groove regions.

2. The method according to claim 1, wherein:
   a plurality of device layers are formed on the device regions of the first surface of the to-be-processed wafer;
   dicing grooves are formed between adjacent device layers and in the dicing groove regions; and
   the plurality of device layers are bonded with the first surface of the capping wafer.

3. The method according to claim 2, wherein the device layers further include:
   device structures formed in the device regions of the first surface of the to-be-processed wafer;
   a dielectric layer formed on the first surface of the to-be-processed wafer to cover the device structures; and
   electrical interconnect structures formed within the dielectric layer and having a top surface exposed by the dielectric layer.

4. The method according to claim 3, wherein bonding the first surface of the capping wafer with the first surface of the to-be-processed wafer further includes:
   pressing the first surface of the to-be-processed wafer on the first surface of the to-be-processed wafer onto the first surface of the capping wafer; and
   performing a thermal annealing process to cause a top surface of the electrical interconnect structure to fuse with the first surface of the capping wafer.

5. The method according to claim 4, wherein:
   the first surface of the capping wafer has a plurality of conductive layers corresponding to the top surface of the electrical interconnect structures; and
   the conductive layers are fused with the electrical interconnect structures in the dielectric layer of the first surface of the to-be-processed wafer.

6. The method according to claim 4, wherein:
   an insulation layer is formed on the first surface of the capping wafer; and
   the insulation layer is fused with the dielectric layer of the first surface of the to-be-processed wafer.

7. The method according to claim 1, further including:
   cleaning the second surface of the thinned capping layer, prior to etching the thinned capping wafer, wherein:
   the second surface of the capping wafer is cleaned by a wet cleaning process; and
   a cleaning solution of the wet cleaning process is de-ionized water.

8. The method according to claim 7, wherein:
   the cleaning solution is sprayed toward the second surface of the capping wafer; and
   a spray direction of the cleaning solution has a predetermined angle with the second surface of the capping wafer.

9. The method according to claim 7, after cleaning the second surface of the capping wafer and before etching the capping wafer, further including:
   performing a speed ring dry process.

10. The method according to claim 1, wherein:
    the radius of the to-be-processed wafer is reduced in a range of approximately 3 mm~5 mm.

11. The method according to claim 1, wherein:
the edge trimming process uses a knife feeding from an edge of the to-be-processed wafer to a center of the to-be-processed wafer to reduce the radius of the to-be-processed wafer.

12. The method according to claim 11, wherein:
a rotation speed of the knife is in a range of approximately 2000 rpm~3000 rpm; and
a feeding depth of the knife is in a range of approximately 400 μm~750 μm.

13. The method according to claim 1, wherein:
a thickness of the grinded capping wafer is in a range of approximately 3 μm~400 μm.

14. The method according to claim 1, wherein etching the capping wafer further includes:
forming a mask layer exposing a portion of the grinded capping wafer corresponding to the dicing groove regions of the to-be-processed wafer on the second surface of the to-be-processed wafer; and
etching the grinded capping wafer using the mask layer as an etching mask until the dicing groove regions of the to-be-processed wafer are exposed.

15. The method according to claim 14, wherein:
a plurality of the testing pads are formed in the dicing groove regions of the to-be-processed wafer; and
a performance of the device regions of the to-be-processed wafer is tested through the testing pads after etching the grinded capping wafer to expose the dicing groove regions of the first surface of the to-be-processed wafer.

16. The method according to claim 1, wherein:
after the edge trimming process, the to-be-processed wafer has a trimmed edge perpendicular to the first surface of the to-be-processed wafer.

* * * * *